United States Patent [19]

Paidassi et al.

[11] Patent Number: 5,702,829
[45] Date of Patent: *Dec. 30, 1997

[54] MULTILAYER MATERIAL, ANTI-EROSION AND ANTI-ABRASION COATING INCORPORATING SAID MULTILAYER MATERIAL

[75] Inventors: Serge Paidassi, Grenoble; Jacques Ernoult, St Etienne de Crossey; Michel Brun, Bizanos; Pierre Monge-Cadet, Serres-Torlaas; Yves Pauleau, Grenoble; Guy Farges, La Ville Du Bois, all of France

[73] Assignees: Commissariat a l'Energie Atomique, Paris; Turbomeca, Cedex; L'Etat Francais represente par le Delegue general pour l'Armement, Armees, all of France

[*] Notice: The term of this patent shall not extend beyond the expiration date of Pat. No. 5,547,767.

[21] Appl. No.: 634,899

[22] Filed: Apr. 26, 1996

Related U.S. Application Data

[63] Continuation of Ser. No. 75,519, Jul. 14, 1993, Pat. No. 5,547,767.

[30] Foreign Application Priority Data

| Oct. 14, 1991 | [FR] | France | 91 12616 |
| Jul. 9, 1992 | [FR] | France | 92 08500 |

[51] Int. Cl.⁶ .................................................. B32B 15/00
[52] U.S. Cl. ...................... 428/610; 428/627; 428/635; 428/665
[58] Field of Search ........................ 428/610, 665, 428/635, 627, 681, 651, 680

[56] References Cited

U.S. PATENT DOCUMENTS

| Re. 34,173 | 2/1993 | Kerber | 428/660 |
| 4,419,202 | 12/1983 | Gibson | 204/192.16 |
| 4,761,346 | 8/1988 | Naik | 428/627 |
| 4,799,977 | 1/1989 | Rausch | 428/610 |
| 4,855,188 | 8/1989 | Garg et al. | 428/665 |

FOREIGN PATENT DOCUMENTS

| 0 106 638 | 4/1984 | European Pat. Off. |
| 0 186 266 | 7/1986 | European Pat. Off. |
| 3811907 | 8/1989 | Germany | 209/192.16 |
| 84 04110 | 10/1984 | WIPO |

OTHER PUBLICATIONS

Patent Abstracts of Japan, vol. 10, No. 90 (C–337) (2147) 8 Apr. 1986 & JP A 60 221 565 (Matsushita Denki Sangyo KK) 6 Nov. 1985.

Patent Abstracts of Japan, vol. 2, No. 56 (E) (1489) 24 Apr. 1978 & JP A 53 021 902 (Fujitsu KK) 28 Feb. 1978.

J. of Vacuum Science and Technology, vol. 6, No. 3, 1 May 1988, New York, pp. 1646–1649; H. Y. Yang et al.: "Investigation of Diffusion Barriers".

Database WPI, Week 5077, Derwent Publications Ltd., London, GB; AN 77–88940Y 50 & JP A 52 130 490 (Mitsubishi Metal MI) 1 Nov. 1977.

Database WPIL, Week 3484, Derwent Publications Ltd., London, GB; AN 84211127 34 & JP A 59 123 765 (Toho Kinzoku KK) 17 Jul. 1984.

*Primary Examiner*—John J. Zimmerman
*Attorney, Agent, or Firm*—Pearne, Gordon, McCoy & Granger LLP

[57] ABSTRACT

The present invention relates to a multilayer material useful as an anti-erosion and anti-abrasion coating, and to a process for producing the multilayer material at low temperatures. The multilayer material comprises a substrate covered with at least one metallic tungsten ductile layer and at least one hard layer of a solid solution of an additional element chosen from carbon or nitrogen or a mixture of carbon and nitrogen in tungsten or a tungsten alloy, the two types of layers ar alternating. The multilayer material is particularly useful as a coating for parts used in aeronautics.

10 Claims, 5 Drawing Sheets

5,702,829

MULTILAYER MATERIAL, ANTI-EROSION AND ANTI-ABRASION COATING INCORPORATING SAID MULTILAYER MATERIAL

This is a continuation of application Ser. No. 08/075,519, filed Jun. 14, 1993, now U.S. Pat. No. 5,547,767, dated Aug. 20, 1996.

FIELD OF THE INVENTION

The present invention relates to a multilayer material more particularly for permitting the production of an anti-erosion and anti-abrasion coating, as well as to the process for producing this multilayer material.

The erosion of materials forming mechanical parts subject to the impact of abrasive particles such as sand or dust is a well known industrial problem, e.g. in the aeronautical field. Thus, in the case of compressor blades used in gas turbine engines for aircraft, wear by erosion to the leading edges of the blades leads to a deterioration of the performance characteristics of the engine. In the same way, turbine blades used in electrical power stations are subject to external attacks by solid, hard particles such as e.g. sand or alumina. These problems also occur in other technical fields.

The erosion rate of the materials is defined by the volume or mass of eroded material for a given mass of instant particles. This erosion rate varies with the incidence angle of the solid particles striking the surface of the material in question.

DESCRIPTION OF THE RELATED ART

The erosion mechanisms have been studied by various authors and in particular by J. P. Massoud, "Behaviour relative to erosion by solid particles of a laser-treated T6V titanium alloy", PhD material engineering thesis, Lyon INSA, 1988. These studies have made it possible to make a distinction between two types of behavior of materials subject to erosion. The first is a behavior characteristic of ductile materials such as metals, which deteriorate as a result of the appearance of scratches and the removal of shavings. Their erosion rate is low with a solid particle jet with normal incidence (with respect to the material plane), but is very high at low impact angles, i.e. approximately 20° to 30°. There is also the characteristic behavior of fragile materials such as glass, ceramics and hard materials (carbides), for which the energy transfer by impact leads to the appearance of cracks producing the removal of material in the form of chips and splinters. The erosion rate of these materials is low with a particle jet having a limited incidence angle (20° to 30°) and high with incidence angles of approximately 50° to 90°.

These two behaviors are respectively illustrated in the attached FIGS. 1 and 2 showing the erosion rate of the tested material as a function of the incidence angle of the eroding particles.

In addition, complimentary studies carried out by T. Foley and A. Levy, "The effect of heat treatment on the erosion behavior of steel", Proceedings of the Conference on Wear of Materials, Reston, Va., Apr. 11–14, 1983, ASME, 1983, p 346, have demonstrated that the microstructure of the material also plays an important part. For example, the erosion rate of steels under different microstructural states (e.g. XC75 steel in the form of coarse perlite, fine perlite or a globular structure or XC20 steel in its three globular forms) is directly linked with the distribution of the hard, fragile and ductile phases in the alloy, whereas the hardness of these steels only varies slightly with the state of the microstructure.

In addition, the erosion also varies as a function of the shape, size and distribution of the precipitates covering a substrate. G. Hickey, D. Boone, A. Levy and J. Stiglich, "Erosion of conventional and ultrafine-grained materials", Thin Solid Films, 118, 321, 1984, have demonstrated that fine SiC precipitates on steel had a better erosion resistance than a coarse precipitate.

Finally, the erosion rate is dependent on a certain number of parameters linked with the nature of the eroding agent (size and shape of the eroding particles, their hardness and their fragility), as well as the testing conditions, i.e. the speed of the eroding particles and their angle of incidence.

Consequently, the above studies and research show that numerous parameters can occur and influence the erosion phenomena and sometimes it is difficult to appropriately compare the behavior of different materials. It is also difficult to develop equipment and processes for protecting the surface against erosion and abrasion by eroding particles, which have a wide size range and whose incidence angles vary enormously. However, in order to satisfy the said erosion problems, certain materials have already been proposed.

Thus, various materials such as alloys of refractory metals, carbides, nitrides or borides have been investigated and used as anti-erosion coatings. These materials have e.g. been deposited on aircraft compressor blades using various procedures, such as plasma spraying, chemical vapor deposition or CVD, the transferred arc process, the cathodic sputtering process and other physical or chemical deposition procedures.

A pack cementation process is also known and this is presently used for coating with aluminium superalloy blades operating under oxidizing, corrosive and abrasive conditions. This treatment is carried out at a temperature exceeding 1000° C. for several hours and can consequently not be applied to parts made from steel or alloys, whose mechanical properties are deteriorated by thermal treatments at high temperatures.

With the aid of solving this problem and developing deposition processes operating at low temperatures, so as to in particular make it possible to treat ferrous alloy materials, C. L. Yaws and G. F. Wakefield "Proceedings of the 4th International Conference on chemical vapor deposition" published by G. F. Wakefield and J. M. Blocher Jr., The Electrochemical Society Inc., Pennington, N.J. 1973, pp 173 and 577, developed a process for depositing titanium carbonitride on stainless steel compressor blades. Deposition is brought about by a chemical reaction from the gaseous phase $TiCl_4$—$N(CH_3)_3$—$N_2$—$H_2$ (CVD process) at between 600° and 700° C. The carbonitride adheres to the steel as a result of a fine nickel layer interposed between the coating and the substrate.

U.S. Pat. No. 3,951,612 describes the production of chromium carbide ($Cr_7C_3$) anti-erosion coatings on titanium alloy or steel compressor blades coated beforehand with a nickel coating. The nickel coating improves both the adhesion of the carbide coating and the mechanical properties of the composite coating. $Cr_7C_3$ deposits are made at relatively low temperatures between 450° and 650° C. This process is carried out by the thermal decomposition of chromium dicumene $(C_9H_{12})_2Cr$. According to the authors of this patent, this two-layer coating has a slightly less satisfactory erosion resistance than that proposed by G. F. Wakefield, but it has a very good resistance to thermal and mechanical shocks. This is an improvement compared with the titanium carbonitride coating, which is more fragile and brittle and which also leads to a 30 to 50% fatigue resistance deterioration of the coated parts.

Another type of multilayer coating is described in EP-A-366 289, according to which the protecting structure has ceramic layers alternating with metallic layers. The ceramic and the metal have complimentary erosion resistance characteristics, one being more fragile, whereas the other is more ductile and this coating is considered to give the substrate on which it is deposited a good resistance to erosion and corrosion. The concentration of materials at the interfaces is progressive in order to improve the adhesion and uniformity of the coating. The protective coating is deposited on the substrate by cathodic sputtering in the reactive mode for the ceramic material.

According to this patent, the metal layer is of titanium and the ceramic layer of titanium nitride. This type of coating can bring about an improvement to the erosion behavior in the case of relatively small eroding particles and in the case of small impact angles. However, it has been found that multilayer materials constituted by a relatively soft metal, such as titanium, as well as a ceramic such as titanium nitride, have a mediocre behavior during erosion tests carried out with large impact angles, with large particles and high velocities. Although this phenomenon has not been clearly explained, it is assumed to be due to the limited hardness of the multilayer coating resulting from the soft metal layer leading to a significant deformation at high energies of the ceramic material, which by its very nature is fragile.

A deposition process similar to CVD and which is called CNTD (controlled nucleation thermochemical deposition) is described in U.S. Pat. Nos. 4,162,345, 4,147,820, 4,040,870 and 4,153,483. These processes make it possible to respectively produce the deposit on a substrate of hard layers containing tungsten or molybdenum and carbon, hard layers containing titanium and boron, carbon or silicon and hard layers containing titanium and boron. These coatings have a particularly good erosion resistance. The deposits are generally made at temperatures between 650° and 1100° C. The deposited materials have a non-columnar structure constituted by small crystallites, which give these coatings the sought mechanical and erosion resistance properties.

In the aviation field, compressor blades at temperatures below 450° C. are generally made from titanium alloys having a high specific strength. Use of these alloys has become generalized, although their tribological properties and their erosion resistance are mediocre. In order to increase their life, it is consequently necessary to protect them by an anti-erosion coating deposited at below 400° C. so as not to bring about a deterioration of the mechanical properties of said titanium alloy. The authors of the aforementioned U.S. patents have proposed, cf. D. G. Bhat and R. A. Holzl, "Microstructural evaluation of CM 500L, a new W—C alloy coating deposited by the controlled nucleation thermochemical deposition process", Thin Solid Films, 95, 105, 1982, a CNDT process operating at a relatively low temperature of 350° to 550° C. in order to obtain an anti-erosion coating called CM 500ML.

The deposited material contains two phases, namely a tungsten phase and a $W_3C$ phase, the structure being constituted by small, non-columnar, tungsten crystallites (a few hundred nm) and the carbide phase is dispersed in said metal matrix. The carbon content typically varies from 7 to 23 atomic % (0.5 to 1.5 weight %). This material has excellent anti-erosion properties EP-A-411 646 describes a multilayer coating which is resistant to erosion and abrasion and more particularly intended to provide protection against the impacts of relatively large particles, having a first tungsten layer and a second layer containing a mixture of tungsten and tungsten carbide.

Another coating resistant to abrasion and erosion is described in EP-A-328 084. This coating also has a composite structure in which a substantially pure, intermediate tungsten layer is deposited on the substrate under a layer of a mixture of tungsten and tungsten carbide.

Use is often made of tungsten in protective structures due to its specific mechanical properties and in particular its high hardness (1100 kg.mn$^{-2}$ in Vickers scale HV) associated with a high modulus of elasticity (406 GN.m$^{-2}$), which gives it a good resistance to erosive wear.

P. N. Dyer, D. Garg, S. Sunder, H. E. Hintermann and M. Maillat, "Wear-resistant coatings containing tungsten carbide deposited by low temperature CVD", 15th International Conference on Metallurgical Coatings, San Diego, Calif., April 1988, describe a CNTD process making it possible to deposit anti-erosion coatings at a temperature below 500° C. These coatings are constituted by a mixture of tungsten and tungsten carbide phases such as $W_2C$, $W_2C+W_3C$ or $W_3C$. The authors have studied and developed hard, lamellar coatings constituted by layers of tungsten and $W_xC$ layers (with x varying between 2 and 3) and incorporating small crystallites. The composition, microstructure, hardness and size of the crystallites are controlled by varying the deposition parameters and particularly the partial methyl oxide (O(CH$_3$)$_2$) pressure in the mixture of reactive gases WF$_6$—O(CH$_3$)$_2$—H$_2$—Ar. The hardness of these coatings is superior to that of the pure $W_2C$ and WC carbides known from the literature.

In "Tungsten carbide erosion resistant coating for aerospace components", Chemical vapor deposition of refractory metals and ceramics, Mat. Res. Soc. Symp. Proc., T. M. Besmann and B. M. Gallois, vol. 168, Materials Research Society, Pittsburg, Pa., 1990, p 213, D. Garg and P. N. Dyer describe results relating to the erosion behavior of multilayer tungsten-tungsten carbide coatings deposited by CNTD. The alternation of the metal and carbide layers not only makes it possible to have a combination of a ductile material and a hard material, but also obtain a compensation of the internal stresses which develop in the layers deposited by CNTD. This makes it possible to obtain thicker coatings, while limiting the risk of adhesion losses and the separation of the coatings. Thus, the thickness of the coating must be the maximum possible in order to bring about the maximum anti-erosion coating life. Experiments have shown that the resistance of these coatings to erosion was superior by a factor of approximately 3 to that of uncoated AM-350 stainless steel substrates.

The fact that the mechanical properties of a coating with a composition-modulated structure can be very different from those of composition-homogeneous coatings has been known for several years. In 1970, J. S. Koehler, Phys. Rev. B., 2, 547, 1970, proposed increasing the mechanical strength of materials by inhibiting the mobility of dislocations as a result of a composition-modulated structure.

The analysis of these literature data reveals the interest of developing a process allowing the low temperature deposition (below 400° C.) of anti-erosion and anti-abrasion coatings protecting low thermal strength, alloy parts from the impacts of solid particles such as sand, silica, alumina or dust.

SUMMARY OF THE INVENTION

Therefore the invention relates to a multilayer material incorporating a substrate covered with at least one ductile layer of metal tungsten or tungsten alloy and at least one hard layer of a solid solution of an addition element chosen from among carbon or nitrogen, in tungsten or in a tungsten alloy, the two types of layers alternating.

Preferably, the carbon content in the solid carbon solution in the tungsten or tungsten alloy is below 25, preferably between 12 and 18 or in even more preferred manner between 14 and 15 atomic %. Preferably, the nitrogen content in the solid nitrogen solution in the tungsten or tungsten alloy is between 0.5 and 15 or preferably between 1 and 10 atomic %. These materials are stable, microcrystalline and hard.

The crystal lattice of the solid solution of the addition element in the tungsten corresponds to that of metallic tungsten, which is very thermally stable, because the melting point of the tungsten is close to 3400° C.

This hard, ductile structure of the multilayer material according to the invention makes it possible to improve the erosion behavior with respect to a wide range of particle sizes. The high hardness is of particular interest at low impact angles of the eroding particles, while a good ductility makes it possible to delay the cracking of the coating at high energy levels and for large particle sizes.

The Vickers hardness of the hard carbon layer in the tungsten reaches 26,000 MPa for a charge of 50 g, when the carbon content in the solid solution is between 14 and 15 atomic %. For comparison purposes, the Vickers hardness of the ductile tungsten layer under the same conditions is approximately 13,000 MPa.

The materials constituted by a stack having a two-layer tungsten/solid carbon solution in tungsten structure have performance characteristics superior to those of coatings constituted solely by the $WC_{1-x}$ carbide carbon solution in tungsten structure have performance characteristics phase. This is possibly due to the fact that the two layers, although having very different hardness levels, have an identical crystal lattice, which gives a high stability to the metal/carbon phase interface.

The hardness of the solid nitrogen solution in the tungsten is a function of the incorporated metalloid level. For example, the Vickers hardness of the solid solution incorporating 6 atomic % nitrogen exceeds 3500 kgf.nm$^{-2}$, i.e. 34,000 MPa under a charge of 100 g (HV hardness 0.1).

In the multilayer material, the substrate is preferably a titanium alloy or stainless steel. However, it would also be possible to choose the material of the substrate from among the following materials: aluminum alloys, nickel alloys, polymers and composite materials. Thus, the deposits can be made on materials presently used, particularly in the aeronautical industry.

The invention also relates to an anti-erosion and anti-abrasion coating incorporating the aforementioned multilayer material.

Finally, the invention also relates to a process for the production of the aforementioned multilayer material comprising introducing a substrate into a cathodic sputtering or evaporation enclosure and performing a cathodic sputtering or evaporation respectively from a target or a source of pure tungsten or tungsten alloy in a plasma alternatively constituted by a rare gas or a mixture of a rare gas and an addition gas, the latter being chosen from among a gas containing carbon and/or nitrogen so as to alternatively deposit on the substrate at least one ductile metallic tungsten or tungsten alloy layer and at least one hard layer of a solid solution of an addition element in tungsten or one of its alloys.

This process makes it possible to make deposits at low temperatures on substrates constituted by alloys or not very thermally stable materials such as aluminum alloys, polymers or composite materials. Thus, it has been found during tests that the temperature of the substrate only rose to 250° to 270° C. during deposition.

This process makes it possible to only use a single equipment for the deposition of multilayer coatings without having to vent the substrates between the deposition operations of the different layers, thus protecting the interfaces against oxidation. Moreover, this process makes it possible to modify the composition of the coating by merely modifying the composition of the plasma within the sputtering enclosure.

This process also makes it possible to carry out the alternation of the layers of materials with a process operating in vacuo, only using the elements to be incorporated into the layers, i.e. the tungsten and the addition element and in the absence of other chemical elements, such as e.g. fluorine, present in the CNTD process and which may contaminate the coating. This contamination more particularly can occur at the interfaces during the modification of the deposition parameters from passing from the deposition of one layer to another. This contamination of the interfaces is prejudicial in that foreign elements are liable to bring about a deterioration of the mechanical properties of the layers and may lead to the propagation or initiation of cracks or the deterioration of the corrosion strength.

Finally, this process makes it possible to automate the substrate charging and discharging operations, as well as the deposition operations.

Advantageously, in the process described hereinbefore, the source of the pure tungsten or one of its alloys used in cathodic sputtering is a magnetron-type target. This makes it possible to deposit the coating at a speed exceeding 2.5 nm/s and obtain thick coatings with a reasonable deposition time. Moreover, these coatings adhere very well to the substrate as a result of the particles ejected from the target reaching the substrate at a kinetic energy of several eV, which corresponds to a relatively high energy compared with that used in other deposition processes.

BRIEF DESCRIPTION OF THE DRAWINGS

The invention is described in greater detail hereinafter relative to non-limitative embodiments and with reference to the attached drawings, wherein show.

DESCRIPTION OF THE PREFERRED EMBODIMENTS

Figure 1:
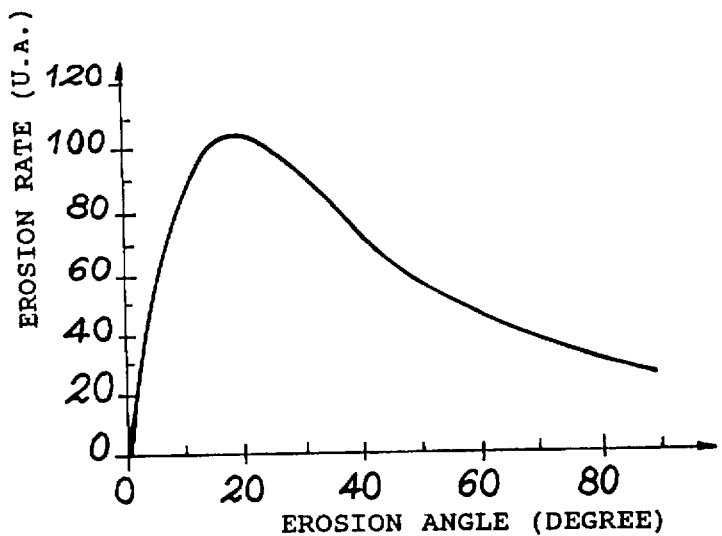
FIGS. 1 and 2 Curves illustrating the relationship between the erosion rate and the incidence angle of eroding particles, respectively for a ductile material of the metallic type and for a fragile material of the carbide type.
Figure 2:
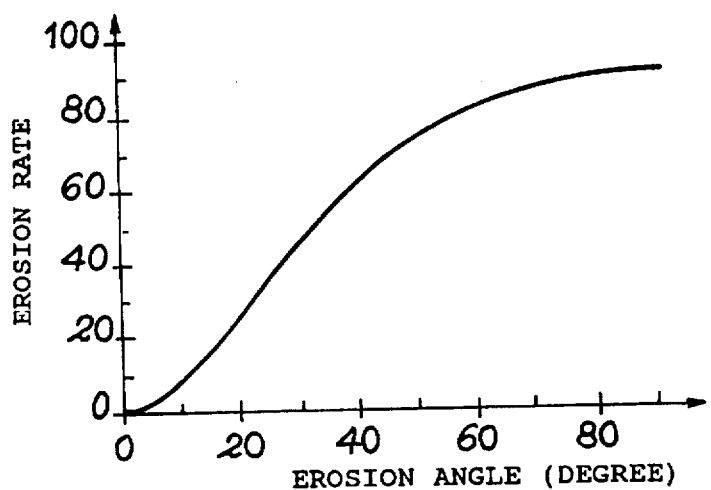
Figure 3:
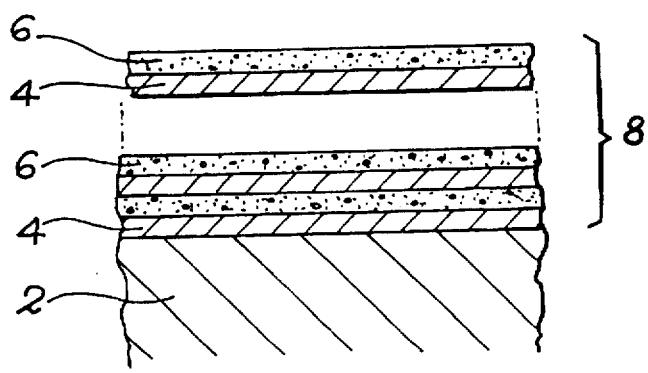
FIGS. 3 to 6 Diagrammatic sections of different embodiments of the multilayer material according to the invention.

As illustrated in FIG. 3, the multilayer material according to the invention comprises a substrate 2 covered with alternating ductile tungsten or tungsten alloy layers 4 and hard layers 6 of a solid solution of an addition element in tungsten or in a tungsten alloy. This alternation of ductile layers and hard layers forms a coating 8. The addition element is chosen from among carbon or nitrogen.

The tungsten alloy usable in the ductile layer 4 or in the hard layer 6 is an alloy constituted by tungsten and one or more other elements chosen from among titanium, zirconium, hafnium, vanadium, niobium, tantalum, chromium, molybdenum, nickel, copper, aluminum, cobalt, iron, platinum and palladium.

As stated hereinbefore, the carbon content in the solid carbon solution 6 in tungsten or a tungsten alloy is below 25, preferably between 12 and 18 or even more preferably between 14 and 15 atomic %. The nitrogen content of the solid nitrogen solution 6 in the tungsten or tungsten alloy is between 0.5 and 15 and preferably between 1 and 10 atomic %.

Figure 4:
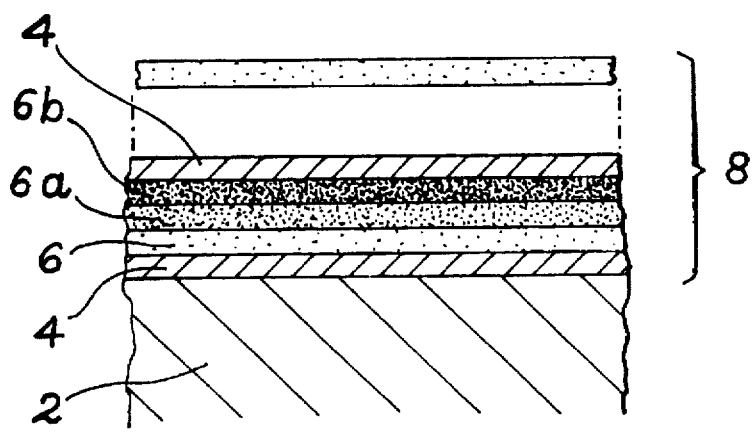

FIG. 4 illustrates a second embodiment of the multilayer material according to the invention. In this case, it successively comprises in alternating manner a ductile tungsten or tungsten alloy layer 4 and at least two hard layers of a solid solution of an addition element in tungsten or one of its alloys. Three hard layers 6, 6a, 6b are shown and which have constant addition element contents within each respective layer, but which increase in the totality of the three successive hard layers. In this case, the content increases between the substrate 2 and the exterior of the coating. In other words, the hard layer 6 closest to the substrate 2 has the lowest addition element content and the layer 6b the highest content.

It should be noted that the superimposing order of the layers could be reversed, the layer 6b then being placed in the vicinity of the substrate 2 and the layer 6 to the exterior of the coating. The choice of the order of the layers is a function of the envisaged application.

Figure 5:
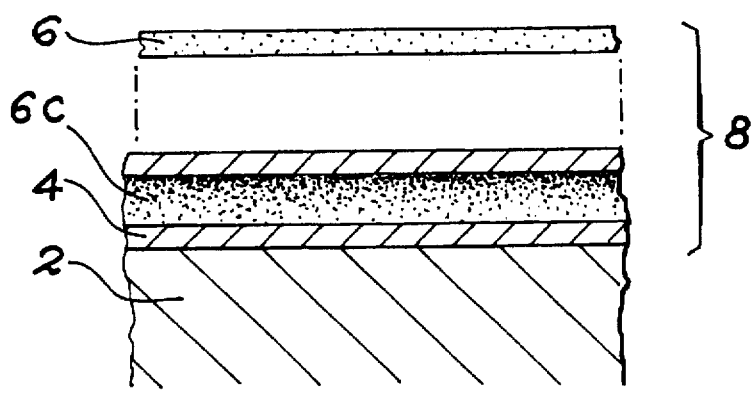

FIG. 5 illustrates a variant similar to FIG. 4, in which at least one of the hard layers is internally provided with an increasing gradient of addition element in the solid solution, the part of said hard layer having the lowest addition element content being directed towards the substrate 2 (or optionally vice versa). The hard layer with the rising gradient is 6c.

Figure 6:
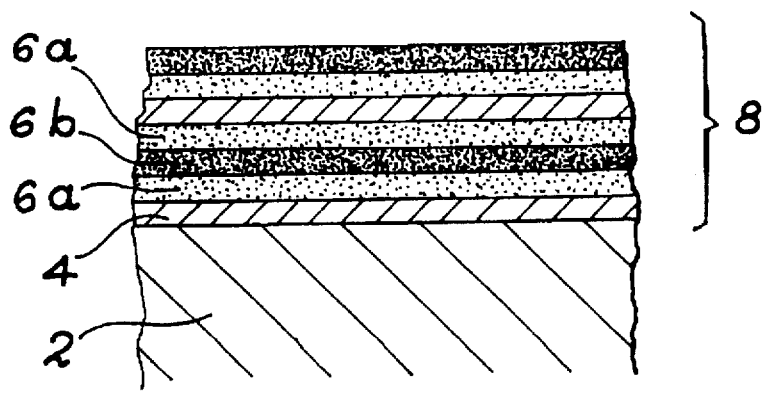

Finally, FIG. 6 illustrates a fourth embodiment of the multilayer material according to the invention. In this case, the substrate 2 is coated with a first tungsten or tungsten alloy layer 4, on which are successively deposited three solid solution layers 6a, 6b, 6a, the addition element content being constant within each hard layer, but two successive hard layers have different addition element contents. Thus, the addition element content of the intermediate layer 6b is higher than that of the two layers 6a on either side. Finally, on said assembly is deposited a second tungsten or tungsten alloy layer 4, which is optionally coated with other layers 6a and 6b. In exemplified manner, substrates have been produced having a tungsten layer covered with three layers of solid nitrogen solutions in tungsten, in which the nitrogen contents were respectively 3, 6 and 3 atomic %.

Preferably, although this is not a limitative feature of the invention, the ductile tungsten or tungsten alloy layer 4 is placed directly in contact with the substrate 2, whilst the outer layer of the coating is a solid solution layer of an addition element in tungsten or one of its alloys.

The number of layers, the thickness of each layer and the total thickness of the thus formed anti-erosion and anti-abrasion coating 8, as well as the addition element concentration of the hard solid solution layers 6 are chosen as a function of the sought degree of protection against abrasion and erosion and as a function of the envisaged application.

The total thickness of the anti-erosion and anti-abrasion coating applied to the substrate can be between 5 and 200 µm and preferably between 10 and 100 µm. The number of layers can be between 2 and 500 and the thickness of each ductile layer 4 and hard layer 6 can be between 0.01 and 50 µm, preferably between 0.05 and 25 µm or in even more preferred manner between 0.2 and 15 µm. For example, in the standard erosion protection applications, the total thickness is generally between 40 and 80 µm.

The successive deposition of the ductile tungsten layers 4 and the hard layers 6 is carried out on a substrate 2, e.g. polished with diamond paste. Deposition preferably takes place under a reduced pressure, e.g. in a low pressure enclosure equipped with a known device for bringing about the vapor phase, such as a cathodic sputtering or electron beam bombardment system.

This apparatus can operate with or without a magnetic field, in the diode or triode mode, being supplied with alternating or direct current, combined with an electric field established between the substrate 2 and the tungsten or tungsten alloy source, under plasma-producing pressure conditions. In the case of a deposition by cathodic sputtering, use is generally made of a planar pure tungsten or tungsten alloy target, preferably of the magnetron type.

This deposition by evaporation or cathodic sputtering takes place in a plasma alternatively constituted by a rare gas (e.g. argon) or a mixture of a rare gas and an addition gas, the latter being chosen from among a gas containing carbon or nitrogen, as a function of whether it is wished to obtain the deposition of a solid solution respectively of carbon or nitrogen in tungsten or one of its alloys. The gas containing the carbon is preferably a hydrocarbon and in particular methane. It also falls within the scope of the Expert to introduce an addition gas simultaneously containing carbon and nitrogen, in order to deposit a mixed solid solution containing carbon and nitrogen as addition elements.

Working takes place under a rare gas pressure preferably between 0.1 and 10 Pa (e.g. 0.3 Pa) and a partial nitrogen or methane pressure preferably between 0.01 and 1 Pa, as a function of the nature of the deposit which it is wished to obtain. This pressure is determined as a function of the power density applied to the deposition source and the distance between the source and the substrate.

Taking account of the volume of the enclosure and the size of the cathodic sputtering or evaporation source the various settings such as the distance between the substrate 2 and the source are carried out in accordance with conventional procedures. It is necessary to take account of the partial pressure of the gas used for a power density applied to the source and check by crystallographic analysis the product obtained, so as to avoid the formation of a carbide or nitride phase.

When it is wished to form a multilayer material with a solid carbon solution in tungsten, the methane content is varied between 0% for depositing a tungsten or tungsten alloy layer 4 and values exceeding 5% and below 25% by volume for depositing the following hard layer 6. In tests performed, the argon flow rate was 50 cm³/min and the methane rate varied between 4 and 15 cm³/min. The introduction of methane into the sputtering enclosure in order to deposit the hard layer 6 leads to an increase in the total pressure, which then rises to $6.10^{-1}$ Pa, when the argon-methane plasma contains 50% methane.

Thus, contrary to the prior art where deposits were made in the presence of argon and acetylene, it has been found that the use of methane made it possible to obtain very low carbon contents in the tungsten.

When in the tests performed the aim was to form a multilayer material with a solid nitrogen solution in tungsten, the nitrogen content in the plasma was varied between 0% for depositing a tungsten or tungsten alloy layer 4 and values exceeding 9% and below 30% for depositing the following hard layer 6. In these tests, the nitrogen flow rate varied between 10 and 40 cm³/min and the argon rate was close to 100 cm³/min.

The average sputtering power density is preferably between 6 and 12 W/cm² for a magnetron target and the substrate 2 is polarized at −100 V. The substrate 2 is not deliberately heated, but it is found that its temperature which was approximately 150° C. during the surface treatment rises to 250° to 270° C. during the deposition stage.

Figure 7:
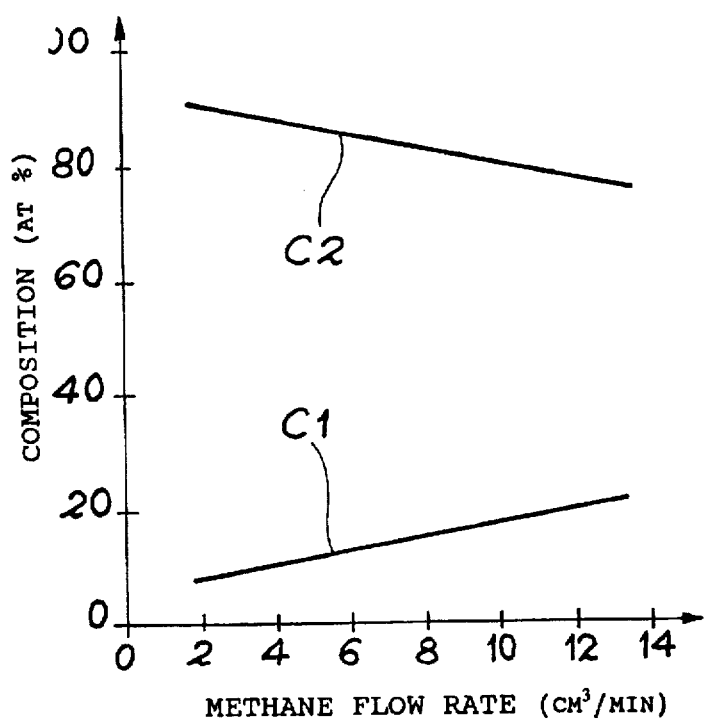
FIG. 7 Two lines $C_1$ and $C_2$ illustrating the respective carbon and tungsten composition of a hard carbon-tungsten layer of the material according to the invention, as a function of the methane flow rate used in the plasma during deposition.

Certain more specific measurements were carried out during the deposition of a solid carbon solution in tungsten. As illustrated in FIG. 7, the carbon content (curve $C_1$) in the layer 6 deposited on the substrate increases linearly when the methane flow introduced into the plasma increases. Conversely, th tungsten content (curve $C_2$) decreases. By varying the methane content in the argon-methane plasma, it is thus possible to obtain two tungsten-carbon material types. When the methane content is below 25% in the argon-methane plasma, the carbon content in the hard layer 6 is below 25 atomic %. However, when the methane content in the plasma is between 25 and 50%, the carbon content of the tungsten-carbon material passes from 30 to 65 atomic %.

However, only the first material obtained containing less than 25 atomic % carbon is of interest in the invention. The crystallographic structure of the first material obtained measured by X-ray diffraction corresponds to that of α phase metallic tungsten. However, the cubic lattice spacing, calculated from diffraction spectra, is higher than that of the metallic tungsten lattice supplied in the literature. The expansion of the lattice spacing increases to 3% when the carbon content in the layer reaches 15 atomic %. This is why it is possible to accept that the layer 6 containing less than 25 atomic % carbon is a solid carbon solution in tungsten. The expansion of the lattice spacing may also be due to the existence of internal mechanical stresses. The expansion of the crystal lattice of the metal can be due to a combination of these two effects.

Figure 8:
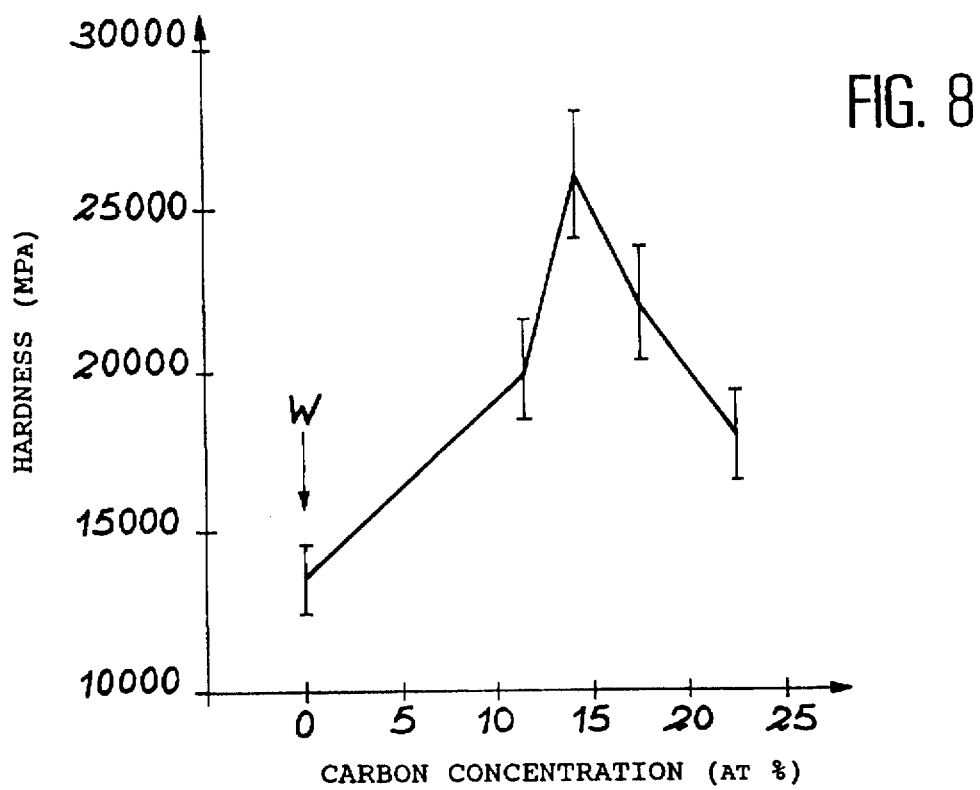
FIG. 8 The variation of the hardness of a hard layer of solid solution of carbon in tungsten of the coating according to the invention, as a function of the carbon content.

The Vickers hardness of the hard layer 6 increases progressively with the carbon content, as illustrated in FIG. 8. Thus, under a load of 50 g, the said hardness reaches a peak of 26,000 MPa for a solid carbon solution in tungsten containing approximately 15 atomic % carbon. Beyond 15 atomic % carbon, the hardness of the coating decreases when the carbon content increases.

For illustration purposes, a number of examples of a multilayer material according to the invention will now be given, as well as the results of erosion tests performed on some of these materials.

Multilayer material with solid solutions containing carbon

The deposition of double layers 4 and 6 according to the invention was carried out on a TA6V titanium alloy substrate using the aforementioned cathodic sputtering deposition method. The hard layers 6 were formed by a solid carbon solution in tungsten. The carbon content in the solid solution 6 was 15 atomic %, which corresponds to the maximum hardness of 26,000 MPa. The total thickness of the coating 8 was approximately 60 µm.
There were two variants:

EXAMPLE 1

The thickness of the elementary layers of tungsten 4 or solid solution 6 with 15 atomic % carbon was 10 µm and in all 6 layers were deposited.

EXAMPLE 2

The thickness of the elementary layers of tungsten 4 or solid solution 6 with 15 atomic % carbon was 5 µm and 12 layers were deposited.

EROSION TEST PERFORMED ON EXAMPLES 1 AND 2, on TA6V AND ON A COMPARATIVE EXAMPLE 1

COMPARATIVE EXAMPLE 1

A comparative example was obtained by carrying out the successive deposition of pure tungsten and tungsten carbide layers. The thickness of the elementary tungsten and tungsten carbide layers with 40 atomic % carbide was 5 µm and in all 12 layers were deposited. The substrate was of TA6V titanium alloy.

Figure 9:
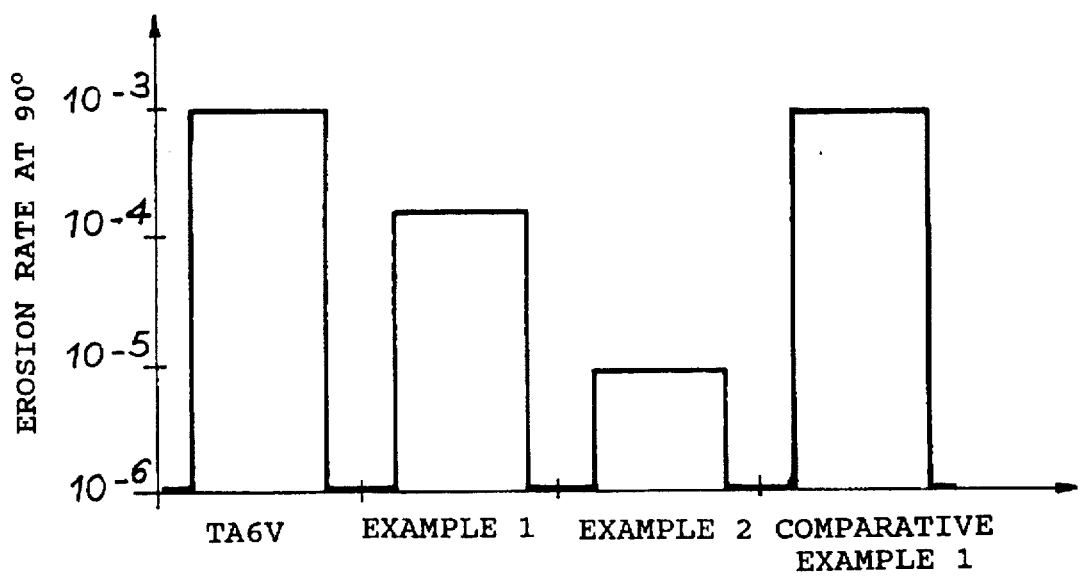
FIG. 9 A diagram illustrating the erosion rate of the two examples of multilayer material obtained according to the invention compared with controls, the erosion being performed with eroding particles reaching the surface of said material with an incidence angle of 90°.
Figure 10:
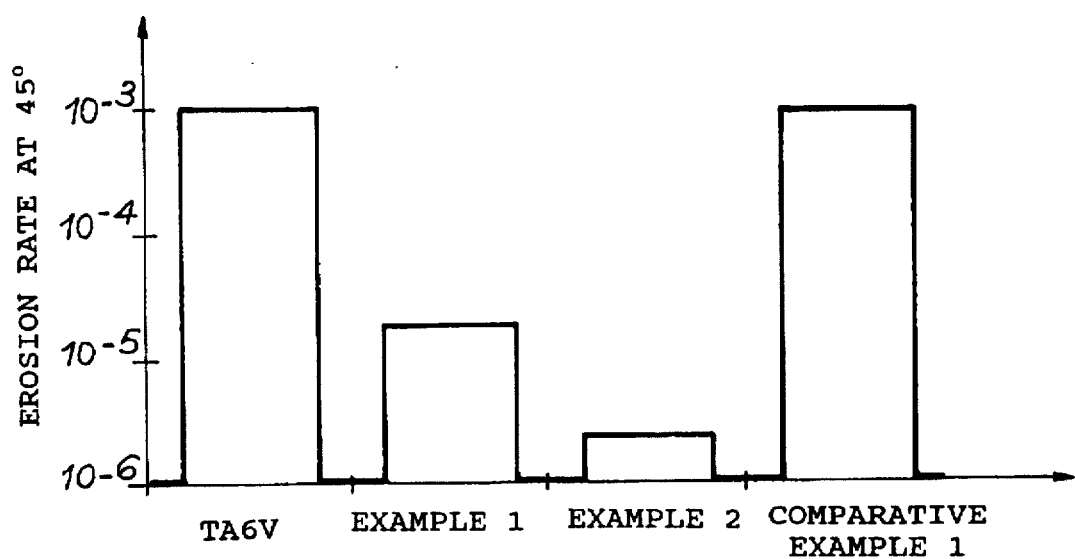
FIG. 10 Similar to FIG. 9, except with respect to the incidence angle which is 45°.

The multilayer materials produced in accordance with the three aforementioned examples and TA6V underwent erosion tests, whose results are given in FIGS. 9 and 10. The erosion rate values are expressed by the ratio between the coating mass lost by erosion and the eroding particle mass used in the test. The lower the erosion rate the better the tested sample. These erosion tests were carried out in accordance with two incidence angles of the eroding particles, respectively 90° and 45° and represented respectively in FIGS. 9 and 10. The eroding agent was quartz with a grain size of 160 µm, the eroding agent flow rate was 6 g/min and the carrier air velocity was 240 m/s.

The erosion rate of the uncoated TA6V alloy substrate is equal to or higher than $10^{-3}$ g/g for incidence angles of 90° and 45°. This also applies with respect to the erosion rate of the tungsten/tungsten carbide material of comparative example 1.

As can be seen from FIGS. 9 and 10, the multilayer coating produced according to example 1 makes it possible to improve the erosion resistance by a factor of 10 or 100 compared with TA6V alone, depending on whether the incidence angle of the eroding particles is 90° or 45°. The multilayer coating corresponding to example 2 leads to an improvement of the erosion resistance by a factor of 100 or approximately 200 depending on whether the incidence angle of the particles is 90° or 45°. Therefore the second coating is better than the first and has performance characteristics greatly superior to those of the tungsten/tungsten carbide coatings of comparative example 1.

Multilayer material with solid solutions containing nitrogen

EXAMPLE 3

Use is made of a vacuum deposition equipment equipped with a planar magnetron, cathodic sputtering source, having a tungsten target of purity 99.5. The steel or titanium alloy substrates connected to the negative pole of a direct current generator are positioned facing the source at a distance of 9 cm.

After obtaining a pressure below $8 \times 10^{-4}$ Pa in the deposition enclosure, argon is introduced up to a pressure of 0.3 Pa. This is followed by cleaning of the substrate by cathodic sputtering under a voltage of −200 V, for 30 min and the deposition source with a power density of 12 W.cm$^{-2}$, for 10 min.

Following these two operations, the substrate is coated. The bias voltage of the substrate is reduced to −100V and the power density applied to the source remains unchanged. Under these conditions, a tungsten layer with a thickness of 2 μm is obtained in 6 minutes, i.e. a deposition rate of 5.5 nm.s$^{-1}$.

When the desired tungsten layer thickness is reached, sequential introduction takes place of a nitrogen flow until a partial pressure of 0.045 Pa is obtained, which corresponds to a nitrogen flow of 50 standard cm$^3$/minutes$^{-1}$ (50 sccm), the partial argon pressure is 0.3 Pa and the power density applied to the source of 12 W.cm$^{-2}$ remaining unchanged. These parameters lead to the formation of a tungsten-nitrogen solid solution layer 2 μm thick within 8 minutes, i.e. a deposition rate of 4.2 nm.s$^{-1}$.

The nitrogen flow is then stopped and the sequence repeated 14 times until a multilayer coating with a total thickness of 56 μm is obtained.

EXAMPLE 4

The titanium alloy substrate (TA6V) and the sputtering source are cleaned, working taking place at a partial argon pressure of 0.2 Pa and a power density to the source of 12 W.cm$^{-2}$.

The first pure tungsten layer with a thickness of 12 μm is deposited in a pure argon atmosphere at a speed of 5.5 nm.s$^{-1}$.

The second, 12 μm thick, solid nitrogen solution layer is deposited in the presence of a partial nitrogen pressure of 0.06 Pa, i.e. a nitrogen flow of 10 sccm, at a speed of 5.4 nm.s$^{-1}$.

The third, 12 μm thick, solid nitrogen solution layer is deposited with a nitrogen flow of 20 sccm, corresponding to a partial nitrogen pressure of 0.016 Pa, at a speed of 5 nm.s$^{-1}$.

The fourth, 12 μm thick, solid nitrogen solution layer is deposited with a nitrogen flow of 30 sccm, corresponding to a partial nitrogen pressure of 0.025 Pa, at a speed of 4.7 nm.s$^{-1}$.

The fifth, 12 μm thick solid nitrogen solution layer is deposited with a nitrogen flow of 40 sccm, corresponding to a partial nitrogen pressure of 0.035 Pa, at a speed of 4.4 nm.s$^{-1}$.

With such a deposition sequence a coating with a total thickness of 60 μm is obtained having a composition gradient and therefore incremented mechanical properties.

EXAMPLE 5

A coating identical to that of example 4 was produced, except that a 0.5 μm thick tungsten layer was interposed between each nitrogen-tungsten solid solution layer.

EXAMPLE 6

After cleaning the substrate and the sputtering source, working took place with a partial argon pressure of 0.3 Pa and a source power density of 12 W.cm$^{-2}$.

The first, 10 μm thick tungsten layer was deposited in a pure argon atmosphere at a speed of 5.5 nm.s$^{-1}$.

The second, 5 μm thick solid solution layer was deposited in the presence of a partial nitrogen pressure of 0.016 Pa, i.e. a nitrogen flow of 20 sccm, at a speed of 5 nm.s$^{-1}$.

The third, 10 μm thick, solid solution layer was deposited with a nitrogen flow of 50 sccm, corresponding to a partial nitrogen pressure of 0.045 Pa, at a speed of 4.2 nm.s$^{-1}$.

The fourth, 5 μm thick, solid solution layer was deposited in the presence of a partial nitrogen pressure of 0.016 Pa, i.e. a nitrogen flow of 20 sccm, at a speed of 5 nm.s$^{-1}$.

This sequence was repeated twice to obtain a multilayer coating 60 μm thick.

EXAMPLE 7

Use was made of a deposition equipment equipped with an electron beam evaporation source with an electric power of 15 kW. The evaporation crucible, with a capacity of 60 cm$^3$, was filled with diameter 20 mm, 5 mm thick tungsten pellets. The substrates were placed above the evaporation source and at a distance of 30 cm.

After placing the deposition enclosure under a vacuum and cleaning the substrates by ion bombardment, the actual deposition phase was carried out. The bias voltage applied to the substrates was reduced to −100 V and the argon pressure to 0.2 Pa. Either manually or by means of an automatic device, the power of the electron beam was regularly raised to 10 kW, so as to progressively bring about the melting of the tungsten and then the evaporation.

The first, 2 μm thick pure tungsten layer was deposited at a speed of 6 nm.s$^{-1}$ The second, 4 μm thick layer was produced in the reactive mode in the presence of a nitrogen low of 40 sccm. The partial nitrogen pressure was maintained at a value of 0.04±0.001 Pa, by adjusting the power of the electron beam.

The sequence was repeated 5 times to obtain a 30 μm thick coating.

EXAMPLE 8

The procedure of example 6 was used, but having as the source a tungsten-chromium, with 3 atomic % chromium, alloy and working at a partial argon pressure of 0.4 Pa and a power density of 11 W.cm$^{-2}$.

The first, 10 μm thick pure tungsten layer was deposited in a pure argon atmosphere at a speed of 5.6 nm.s$^{-1}$.

The second, third and fourth layers were deposited in the manner described in example 6, hut the thickness of the fourth layer was 10 μm. The sequence was repeated twice to obtain a 70 μm multilayer coating.

EROSION TESTS CARRIED OUT ON EXAMPLES 2 AND 5, TA6V AND COMPARATIVE EXAMPLE 2

COMPARATIVE EXAMPLE 2

The titanium alloy substrate (TA6V) was covered with a 60 μm thick, TiN monolayer. The uncoated TA6V alloy and the materials produced according to examples 2 and 5 and comparative example 2 than underwent erosion tests, whose results are given in FIGS. 11 and 12. These erosion tests were carried out under the same conditions as the erosion test described hereinbefore, except that in this case the eroding agent was quartz having grains of 600 μm and the eroding agent flow rate was 2 g/min. These erosion tests were performed in accordance with two incidence angles of the eroding particles, respectively 90° and 30° and shown respectively in FIGS. 11 and 12.

Figure 11:
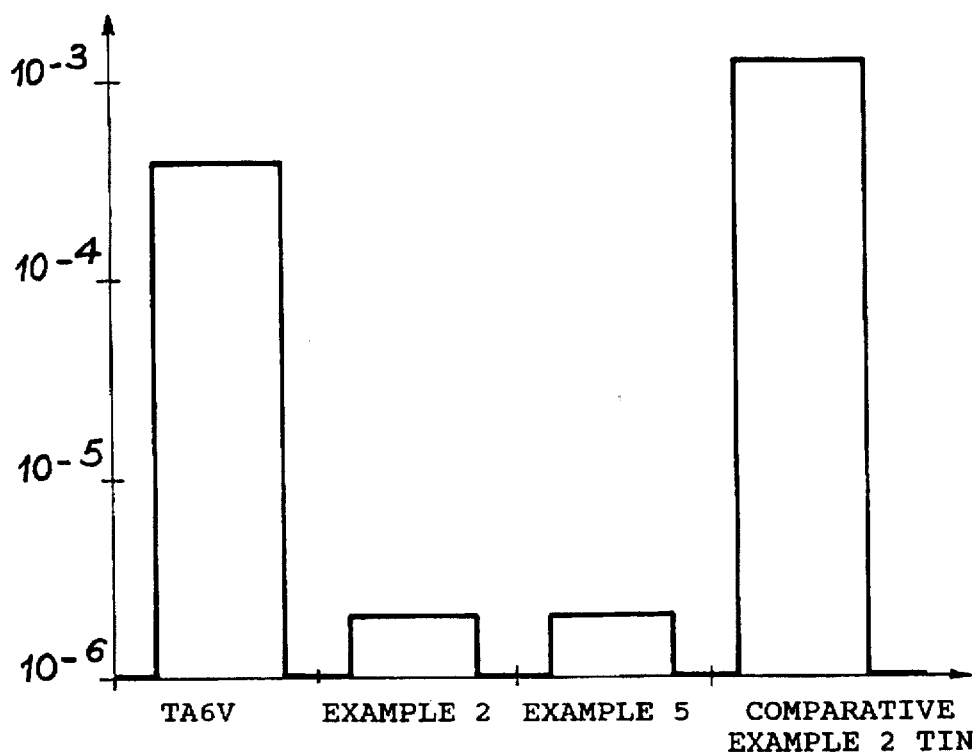
FIG. 11A diagram similar to FIG. 9, but obtained under slightly different erosion conditions.

As can be seen from FIG. 11, the multilayer coating produced according to examples 2 and 5 makes it possible to improve the erosion resistance by a factor of approximately 200 compared with TA6V and approximately 300 compared with TiN.

Figure 12:
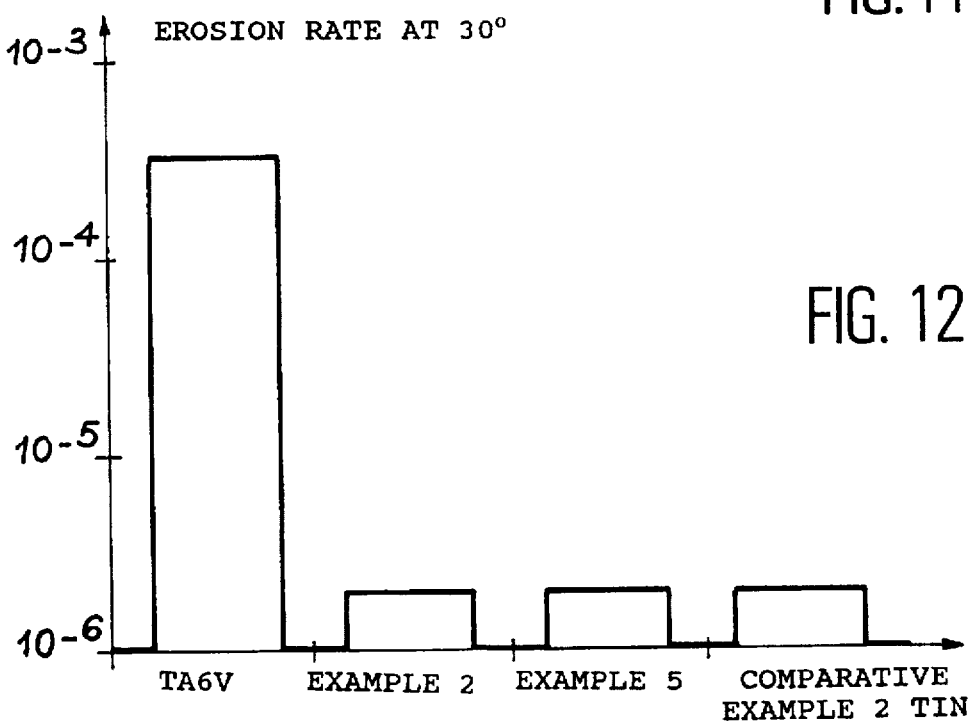
FIG. 12 Similar to FIG. 11, except that the incidence angle is 30°.

As can be gathered from FIG. 12, the multilayer coating according to examples 2 and 5 improves the erosion resistance by a factor of approximately 150 compared with TA6V and is identical to TiN.

We claim:

1. A multilayer material, characterized in that it comprises a substrate covered with at least one ductile, metallic tungsten or tungsten alloy layer and at least one hard layer of a solid solution of nitrogen, in tungsten or in a tungsten alloy, the two types of layers alternating.

2. Multilayer material according to claim 1, characterized in that the nitrogen content in the solid solution is between 0.5 and 15 atomic %.

3. Multilayer material according to claim 1, characterized in that the nitrogen content in the solid solution is between 1 and 10 atomic %.

4. Multilayer material according to claim 1, characterized in that it comprises at least two successive hard layers of solid solution having constant nitrogen contents within each hard layer, and two successive hard layers having different nitrogen contents.

5. Multilayer material according to claim 1, characterized in that it comprises at least two successive hard layers of solid solution having constant nitrogen contents within each hard layer and increasing nitrogen contents within the assembly of successive hard layers.

6. Multilayer material according to claim 1, characterized in that it comprises at least two successive hard layers of solid solution having constant nitrogen contents within each hard layer and increasing nitrogen contents within the assembly of successive hard layers, and in that the hard layer closest to the substrate has the lowest nitrogen content of all the successive hard layers.

7. Multilayer material according to claim 1, characterized in that at least one of the hard layers internally has an increasing gradient of nitrogen in the solid solution, the part of the said hard layer having the lowest nitrogen content being directed towards the substrate.

8. Multilayer material according to claim 1, characterized in that the tungsten alloy used is an alloy constituted by tungsten and one or more other elements selected from the group consisting of titanium, zirconium, hafnium, vanadium, niobium, tantalum, chromium, molybdenum, nickel, copper, aluminum, cobalt, iron, platinum and palladium.

9. Multilayer material according to claim 1, characterized in that the substrate is chosen from among a titanium alloy, stainless steel, an aluminum alloy, a nickel alloy, polymers or composite materials.

10. A mechanical part subject to the impact of abrasive particles including an anti-erosion and anti-abrasion coating, characterized in that it comprises a multilayer material according to any one of the claims 1–9.

* * * * *

UNITED STATES PATENT AND TRADEMARK OFFICE
CERTIFICATE OF CORRECTION

PATENT NO. : 5,702,829
DATED : Dec. 30, 1997              Page 1 of 2
INVENTOR(S) : Serge Paidassi et al.

It is certified that error appears in the above-indentified patent and that said Letters Patent is hereby corrected as shown below:

On the cover page, Section [75], Inventors: delete "Torlaas" and insert --Morlaas--.

Column 4, line 12, delete "$kg.mn^{-2}$" and insert --$kg.mm^{-2}$--.

Column 5, lines 33-34, delete "carbon solution in tungsten structure have performance characteristics".

Column 5, line 42, delete "$kgf.nm^{-2}$" and insert --$kgf.mm^{-2}$--.

Column 7, line 1, insert a space between 11A.

Column 9, line 32, delete "th" and insert --the--.

Column 10, line 22, delete "TEST" and insert --TESTS--.

Column 10, line 23, delete "on" and insert --ON--.

UNITED STATES PATENT AND TRADEMARK OFFICE
CERTIFICATE OF CORRECTION

PATENT NO. : 5,702,829
DATED : Dec. 30, 1997
INVENTOR(S) : Serge Paidassi et al.

It is certified that error appears in the above-indentified patent and that said Letters Patent is hereby corrected as shown below:

Column 11, line 1, delete "99.5" and insert --99.5   --.

Column 11, line 55, after "sequence" insert a comma.

Column 12, line 50, delete "hut" and inseyt --but--.

Column 12, line 62, delete "than" and insert --then--.

Signed and Sealed this

Ninth Day of June, 1998

*Attest:*

BRUCE LEHMAN

*Attesting Officer*    Commissioner of Patents and Trademarks